United States Patent [19]

Benjamin et al.

[11] Patent Number: 4,597,822
[45] Date of Patent: Jul. 1, 1986

[54] METHOD FOR MAKING SILICON WAFERS

[75] Inventors: John L. Benjamin, Liverpool; William R. Van Dell, North Syracuse, both of N.Y.

[73] Assignee: General Electric Company, Syracuse, N.Y.

[21] Appl. No.: 717,364

[22] Filed: Mar. 28, 1985

[51] Int. Cl.$^4$ ............................................. C30B 25/18
[52] U.S. Cl. ........................... 156/612; 156/DIG. 65; 156/DIG. 66
[58] Field of Search ............... 156/DIG. 65, DIG. 66, 156/DIG. 64, 612; 427/86, 289

[56] References Cited

U.S. PATENT DOCUMENTS 4,147,584  4/1979  Garrison et al. .................... 156/612

OTHER PUBLICATIONS

Doo et al., IBM Technical Disclosure Bulletin V. 5, No. 2, 7/62, p. 50–51.

Primary Examiner—Hiram H. Bernstein
Attorney, Agent, or Firm—Robert J. Mooney

[57] ABSTRACT

A method for manufacturing a silicon wafer includes growing a layer of low-resistivity crystalline silicon upon a precision-ground slice of single-crystal, high-resistivity silicon. The slice of single-crystal silicon has a thickness sufficient to withstand handling during the initial part of the processing. The crystalline silicon is built up to a thickness which is sufficient to withstand handling and processing of the finished wafer. The layer of single-crystal silicon is thereupon precision ground to reduce its final thickness to a value required for the devices to be formed thereon. The crystalline layer performs gettering to remove impurities from the single-crystal silicon during normal heating attendant to the formation of the solid-state devices thereon. The present invention further includes a silicon wafer made by the process of the invention.

3 Claims, 6 Drawing Figures

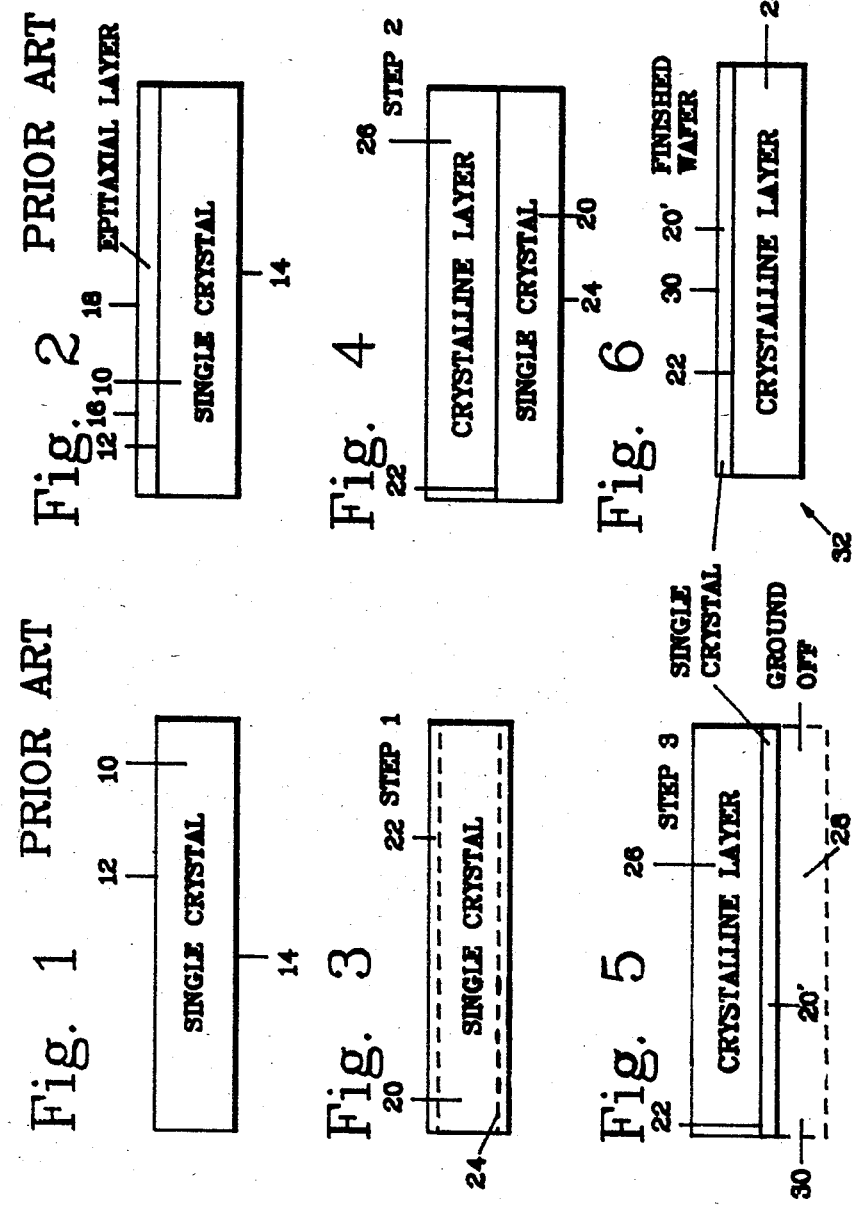

METHOD FOR MAKING SILICON WAFERS

BACKGROUND OF THE INVENTION

The present invention relates to solid state devices and to wafers upon which silicon solid state devices may be fabricated.

Silicon solid state devices such as, for example, transistors, diodes and integrated circuits are conventionally fabricated by building up the devices on the surface of a wafer. Once formed, the devices are separated into individual dice for subsequent packaging and use. Manufacturing economy is urging an increase in wafer size from the conventional 3-inch diameter to 4-inch and larger diameters. As the wafer size increases, maintaining uniformity of processing over the entire surface area of the wafer becomes more difficult. In addition, the stringency of specifications for the wafer continue to increase.

Some types of devices require a high-resistivity silicon layer a few mils thick with a closely controlled impurity level. Such a thickness makes the silicon layer too fragile for unsupported handling during processing, particularly in wafers having diameters of four inches and more. It has thus been the practice to epitaxially grow a thin high-resistivity crystalline silicon layer on a thick low-resistivity single-crystal substrate. The surface of the epitaxial layer being used for the formation of the semiconductor device. As the required resistivity and thickness of the epitaxial layer become larger, the properties of the epitaxial layer become more difficult to control to the level required in demanding applications. That is, at high resistivity and large thickness, surface faults and bulk crystalline defects multiply. This makes the epitaxial layer unsuitable in, for example, the fabrication of bipolar transistors which are capable of operating at voltages in excess of about 1000 volts.

OBJECTS AND SUMMARY OF THE INVENTION

Accordingly, it is an object of the invention to provide a method for manufacturing a silicon wafer, and a wafer made by the process, which overcome the drawbacks of the prior art.

It is a further object of the invention to provide a method for making a silicon wafer, and a silicon wafer made by the process, having improved electrical and mechanical characteristics.

It is a still further object of the invention to provide a method for producing a silicon wafer for semiconductor devices, and a silicon wafer made by the process, which is self-gettering during processing.

It is a still further object of the invention to provide a method for making a silicon wafer consisting of a thick layer of a crystalline, low-resistivity silicon on a precision-ground layer of high-resistivity, single-crystal silicon and a silicon wafer made by the process.

Briefly stated, the present invention provides a method for manufacturing a silicon wafer by growing a layer of low-resistivity crystalline silicon upon a precision-ground slice of single-crystal, yhigh-resistivity silicon. The slice of single-crystal silicon has a thickness sufficient to withstand handling during the initial part of the processing. The crystalline silicon is built up to a thickness which is sufficient to withstand handling and processing of the finished wafer. The layer of single-crystal silicon is thereupon precision ground to reduce its final thickness to a value required for the devices to be formed thereon. The crystalline layer performs gettering to remove impurities from the single-crystal silicon slice during normal heating attendant to the formation of the solid-state devices thereon. The present invention further includes a silicon wafer made by the process of the invention.

According to an embodiment of the invention, there is provided a method for producing a silicon wafer comprising grinding first and second opposed surfaces of a slice of single-crystal silicon to a predetermined flatness, thickness and parallelism, the thickness being sufficient to provide enough strength for subsequent handling, depositing a layer of silicon on the first surface, the layer having a thickness sufficient to provide enough strength for subsequent handling and grinding away an excess portion of the slice of single-crystal silicon from the second surface to reduce the thickness of the slice to a final predetermined thickness.

According to a feature of the invention, there is provided a silicon wfer made by the above process.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 1 is a starting layer for making a silicon wafer according to the prior art.

FIG. 2 is a finished silicon wafer according to the prior art.

FIG. 3 is a starting layer and an indication of the first step in producing a silicon wafer according to an embodiment of the invention.

FIG. 4 is a further step in producing a silicon wafer according to an embodiment of the present invention in which a crystalline silicon layer is grown on the starting layer of FIG. 3.

FIG. 5 is the final step in producing a silicon wafer according to an embodiment of the present invention.

FIG. 6 is the finished silicon wafer produced according to an embodiment of the present invention.

DETAILED DESCRIPTION OF THE PREFERRED EMBODIMENT

Although not limited to any particular type of end device, we contemplate that the present invention is particularly well suited for producing a wafer consisting of a high-resistivity silicon layer, having closely controlled properties, on a low resistivity silicon substrate. Such wafers presently find use in high-power transistors and diodes. Other applications for such wafers may occur to one skilled in the art, and the present invention is indifferent to the end use selected.

Referring to FIG. 1, a slice of single-crystal silicon 10, which may be produced by any conventional method includes first and second faces 12 and 14. At least face 12 is ground flat in preparation for the next step. Referring now to FIG. 2, slice of single-crystal silicon 10 has an epitaxial layer 16 grown upon face 12 by conventional means. For high-voltage applications in particular, slice of single-crystal silicon 10 preferably has low resistivity and epitaxial layer 16 has high resistivity. A face 18 of epitaxial layer 16 is subsequently used for the formation of solid state devices thereon. Since such solid state devices may be conventional, and neither the method for producing them nor the finished devices themselves are considered to be inventive parts of the present invention, further description thereof is omitted.

Epitaxial growth of epitaxial layer 16 is conventionally selected because, during such growth, relatively precise control of the doping of the material being deposited and of the crystal structure can be achieved. As the thickness and the required resistivity of epitaxial layer 16 become greater, satisfactory control of the resistivity and the physical and electrical properties of the crystal becomes more difficult. When thicknesses on the order of a few mils and resistivities on the order of 50 ohm centimeters are desired, the lengthy time required for deposition of epitaxial layer 16 permits bulk crystalline defects to develope. Such bulk crystalline defects may result from, for example, non-uniform growth over the growth area or lattice slip of the crystalline lattice. The existence of such bulk crystalline defects and surface property defects limits the voltage which such a wafer is capable of withstanding.

Referring now to FIG. 3, there is shown a slice of single-crystal silicon 20 which serves as the starting material for the present invention. In contrast to slice of single-crystal silicon 10 of the prior art, in which slice of single-crystal silicon 10 is a low-resistivity material, slice of single-crystal silicon 20 is a high-resistivity material having bulk crystalline properties suitable for the surface upon which the semiconductor devices are to be made. Slice of single-crystal silicon 20 is precision ground on both sides, as indicated by dashed lines, to yield a flat slice having precisely parallel faces 22 and 24. Although different applications may require different properties and flatness, in the preferred embodiment of the invention, slice of single-crystal silicon 20 has a resistivity of about 50 ohm-centimeters and faces 22 and 24 have a flatness of about 5 micrometers and are parallel with about the same tolerances as their flatness. Techniques for producing a raw material from which slice of single-crystal silicon 20 is taken are known in the art. Such techniques include, for example, purification by the float-zone process and doping using neutron transmutation doping. The thickness of slice of single-crystal silicon 20 after precision grinding is not critical, but should be precisely known and sufficient to avoid breakage during handling in subsequent processing. For a 4-inch diameter slice of single-crystal silicon 20, a thickness of about 20 mils appears to be satisfactory.

Referring now to FIG. 4, a grown layer 26 is formed atop face 22 of slice of single-crystal silicon 20. The thickness of grown layer 26 is also not critical but needs merely to be thick enough to have a strength and rigidity sufficient to permit the final product to withstand further processing. In the preferred embodiment, grown layer 26 is from about 12 to about 15 mils thick. The resistivity and other properties of grown layer 26 are not critical since grown layer 26 has little, if any, effect on the electrical properties of solid state devices that are eventually created upon the finished product. In the preferred embodiment, grown layer 26 is a low-resistivity crystalline layer grown by conventional means such as, for example, by contact-vapor deposition (CVD) having a resistivity of, for example, 0.01 ohm-centimeter. Other techniques for growing grown layer 26 such as, for example, epitaxial techniques, may be substituted without departing from the scope of the invention. In addition, although the use of a crystalline material in grown layer 26 offers an additional advantage over the use of a single-crystal material in grown layer 26, crystalline material is only one aspect of the invention and its replacement by a single-crystal grown layer 26 would not be considered to depart from the scope of the invention.

Referring now to FIG. 5, an excess portion 28 of slice of single-crystal silicon 20 is ground off by conventional means, as indicated by dashed lines, to produce a working surface 30 upon which semiconductor devices (not shown) may be formed. The final silicon wafer 32 is shown in FIG. 6.

It will be noted that our process detailed in FIGS. 3-5, essentially inverts the prior art process of FIGS. 1 and 2. That is, whereas the prior art starts out with a single-crystal layer upon which the electrically active silicon layer is epitaxial, we start out with a slice of single-crystal silicon upon which a low-resistivity substrate is grown. Grinding to reduce the thickness of the slice of single-crystal silicon to the desired value also produces the active surface upon which semiconductor devices are grown. The thickness of our starting slice of single-crystal silicon material is not critical and merely requires adequate thickness to provide the desired sturdiness. After it is reinforced by the grown layer, the slice of single-crystal silicon is thinned to its final thickness by grinding.

As noted above, the properties of grown layer 26 are not critical. However, in the preferred embodiment, slice of single-crystal silicon 20 is a crystalline material. It is known that the grain boundaries of crystalline materials are effective at high temperatures to trap and hold impurities. During subsequent processing of silicon wafer 32, temperatures on the order of 2000 degrees F. may be encountered. When grown layer 26 is a crystalline material, impurities in slice of single-crystal silicon 20 are free to migrate within slice of single-crystal silicon 20 and are attracted to, and permanently retained by, the grain boundaries in grown layer 26. This is the equivalent of gettering. Thus, when grown layer 26 is crystalline, silicon wafer 32 is a self-gettering material which can be employed to produce semiconductor devices thereon having superior properties and improved yield.

In the preferred embodiment of the invention, we have discovered that it is possible to control the resistivity and the thickness of slice of single-crystal silicon 20 within closer tolerances than is possible in the prior art. For example, with the present invention, it is possible to control the resistivity of slice of single-crystal silicon 20 within about plus or minus 10 percent of a desired resistivity. Epitaxial growth produces resistivity tolerances of from about plus or minus 25 to 30 percent. Such resistivity tolerances become worse in the prior art device as the resistivity increases. We are able to control the final thickness of slice of single-crystal silicon 20 to within about 4 percent versus a control of about 10 percent in the epitaxial layer of the prior art.

Having thus described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What we claim is:

1. A method for producing a silicon wafer comprising:

grinding first and second opposed surfaces of a slice of single-crystal silicon to a predetermined flatness, thickness and parallelism;

said thickness being sufficient to provide enough strength for subsequent handling;

depositing a layer of silicon on said first surface;

said layer having a thickness sufficient to provide enough strength for subsequent handling; and grinding away an excess portion of said slice of single-crystal silicon from said second surface to reduce said thickness of said slice to a final predetermined thickness.

2. A method according to claim 1 wherein said layer is a crystalline layer, whereby said wafer is self-gettering at elevated temperatures.

3. A method according to claim 1 wherein said layer has a resistivity substantially lower than a resistivity of said slice single-crystal silicon.

* * * * *